(12) United States Patent
Chou et al.

(10) Patent No.: US 8,841,181 B2
(45) Date of Patent: Sep. 23, 2014

(54) METHOD FOR FABRICATING SEMICONDUCTOR DEVICE AND PMOS DEVICE FABRICATED BY THE METHOD

(75) Inventors: Ying-Hung Chou, Tainan (TW); Shao-Hua Hsu, Taoyuan County (TW); Chi-Horn Pai, Tainan (TW); Zen-Jay Tsai, Tainan (TW); Shih-Hao Su, Kaohsiung (TW); Chun-Chia Chen, Taichung (TW); Shih-Chieh Hsu, New Taipei (TW); Chih-Chung Chen, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 136 days.

(21) Appl. No.: 13/414,375

(22) Filed: Mar. 7, 2012

(65) Prior Publication Data

US 2013/0234216 A1 Sep. 12, 2013

(51) Int. Cl.
*H01L 21/336* (2006.01)
*H01L 21/8238* (2006.01)

(52) U.S. Cl.
USPC ........... 438/197; 438/222; 438/226; 438/230; 438/299; 438/300

(58) Field of Classification Search
USPC .................................................. 438/222, 226
See application file for complete search history.

(56) References Cited

U.S. PATENT DOCUMENTS

| 8,357,574 | B2 * | 1/2013 | Yeh et al. | 438/199 |
| 2005/0236694 | A1 * | 10/2005 | Wu et al. | 257/632 |
| 2007/0111467 | A1 | 5/2007 | Kim | |
| 2011/0171804 | A1 * | 7/2011 | Wang et al. | 438/302 |
| 2012/0286376 | A1 * | 11/2012 | Hung | 257/412 |
| 2013/0015525 | A1 * | 1/2013 | Cheng et al. | 257/351 |
| 2013/0049126 | A1 * | 2/2013 | Flachowsky et al. | 257/369 |
| 2013/0126949 | A1 * | 5/2013 | Liao et al. | 257/288 |

* cited by examiner

*Primary Examiner* — Angel Roman
(74) *Attorney, Agent, or Firm* — J.C. Patents

(57) ABSTRACT

A method for fabricating a semiconductor device is described. A gate layer, a C-doped first protective layer and a hard mask layer are formed on a substrate and then patterned to form a first stack in a first area and a second stack in a second area. A second protective layer is formed on the sidewalls of the first and the second stacks. A blocking layer is formed in the first area and a first spacer formed on the sidewall of the second protective layers on the sidewall of the second stack in the second area. A semiconductor compound is formed in the substrate beside the first spacer. The blocking layer and the first spacer are removed. The hard mask layer in the first stack and the second stack is removed.

15 Claims, 4 Drawing Sheets

METHOD FOR FABRICATING SEMICONDUCTOR DEVICE AND PMOS DEVICE FABRICATED BY THE METHOD

BACKGROUND OF THE INVENTION

1. Field of Invention

This invention relates to a semiconductor process, and particularly relates to a method for fabricating a semiconductor device, and a p-type metal-oxide-semiconductor (PMOS) device fabricated by the method.

2. Description of Related Art

In a metal-gate complementary MOS (CMOS) process that includes a gate replacement process, especially a metal-gate SRAM process, the cap layer on the dummy NMOS gates and that on the dummy PMOS gates may be different in the thickness due to precedent fabricating steps. The corners of the dummy gates with thinner cap layers are easily exposed and then react with the metal in the later salicide process to cause dummy gate residue in the gate replacement process.

SUMMARY OF THE INVENTION

Accordingly, this invention provides a method for fabricating a semiconductor device, which can prevent the corner of a gate with a thin cap layer from being exposed.

This invention also provides a PMOS device that is fabricated by the method of this invention.

The method for fabricating a semiconductor device of this invention is described as follows. A gate layer, a first protective layer doped with carbon, and a hard mask layer are formed in sequence on a substrate with a first area and a second area. The hard mask layer, the first protective layer and the gate layer are patterned to form a first stack in the first area and a second stack in the second area. A second protective layer is formed on the sidewalls of the first and the second stacks. A blocking layer is formed in the first area and a first spacer formed on the sidewall of the second protective layer on the sidewall of the second stack in the second area, wherein the blocking layer and the first spacer are formed from the same precursor layer. A semiconductor compound layer is formed in the substrate beside the first spacer. The blocking layer and the first spacer are removed. The hard mask layer in the first stack and the second stack are removed.

The PMOS device of this invention includes a gate on a substrate, a first protective layer doped with carbon on the gate, a second protective layer on a sidewall of the gate, a semiconductor compound layer, and a liner layer. The semiconductor compound layer is disposed in the substrate beside the second protective layer and protrudes out of the surface of the substrate, with a gap present between the second protective layer and the semiconductor compound layer. The liner layer is disposed on the sidewall of the second protective layer, the surface of the substrate in the gap, and the semiconductor compound layer.

In an embodiment of the method of this invention, the blocking layer and the first spacer are formed from the same precursor layer with the following steps. After the precursor layer is formed over the substrate, a mask layer is formed covering the precursor layer in the first area but exposing the precursor layer in the second area. The precursor layer is anisotropically etched using the mask layer as a mask, such that a portion of the precursor layer remains on the sidewall of the second protective layer on the sidewall of the second stack to be the first spacer, and the precursor layer remaining in the first area is the blocking layer. The semiconductor compound layer can be formed as follows. The substrate in the second area is etched using the mask layer, the second stack and the first spacer as a mask, to form recesses in the substrate beside the first spacer. The mask layer is removed. The semiconductor compound is selectively deposited based on the recesses, with the blocking layer and the first spacer as a mask. During the etching process for forming the recesses in the substrate, the hard mask layer in the second stack as a top cap layer of the same is consumed by a certain extent and is therefore lower than the hard mask layer (cap layer) in the first stack.

Since a protective layer doped with carbon is formed on the dummy gate of the second stack with a thinner hard mask layer and such protective layer has a low etching rate, the corner of the dummy gate in the second stack is not exposed in the later removal process of the first spacer and does not react with the metal in the later salicide process, so dummy gate residue does not occur in the gate replacement process.

In order to make the aforementioned and other objects, features and advantages of the present invention comprehensible, a preferred embodiment accompanied with figures is described in detail below.

DESCRIPTION OF EMBODIMENTS

It is noted that the following embodiment is intended to further explain this invention but not to limit its scope. For example, although the following embodiments describes cases where the cap (hard mask) layer on the PMOS gate is thinner than that on the NMOS gate due to the etching for forming the recesses of the S/D regions of the PMOS device, this invention can also be applied to a case where the cap layer on the NMOS gates and that on the PMOS gates have different thicknesses due to other kinds of precedent fabricating steps.

Figure 5:
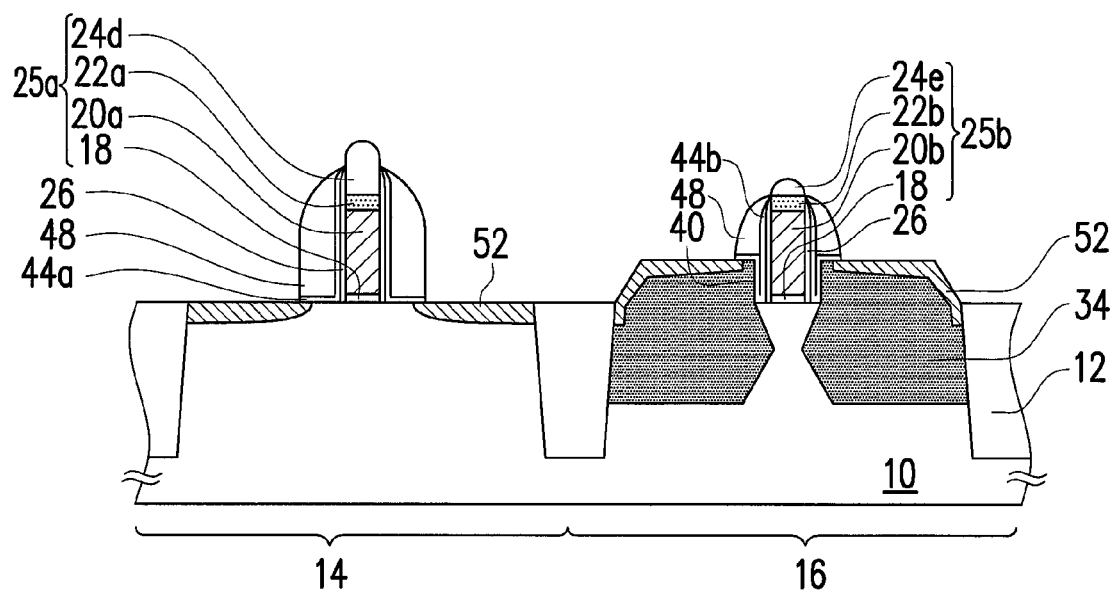
Figure 6:
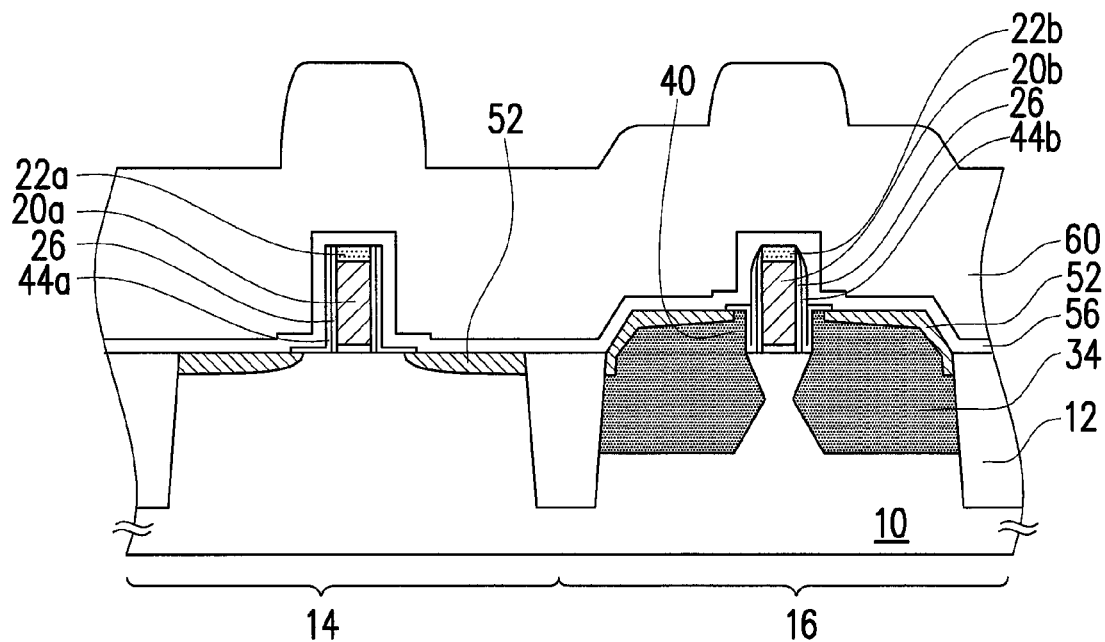
Figure 7:
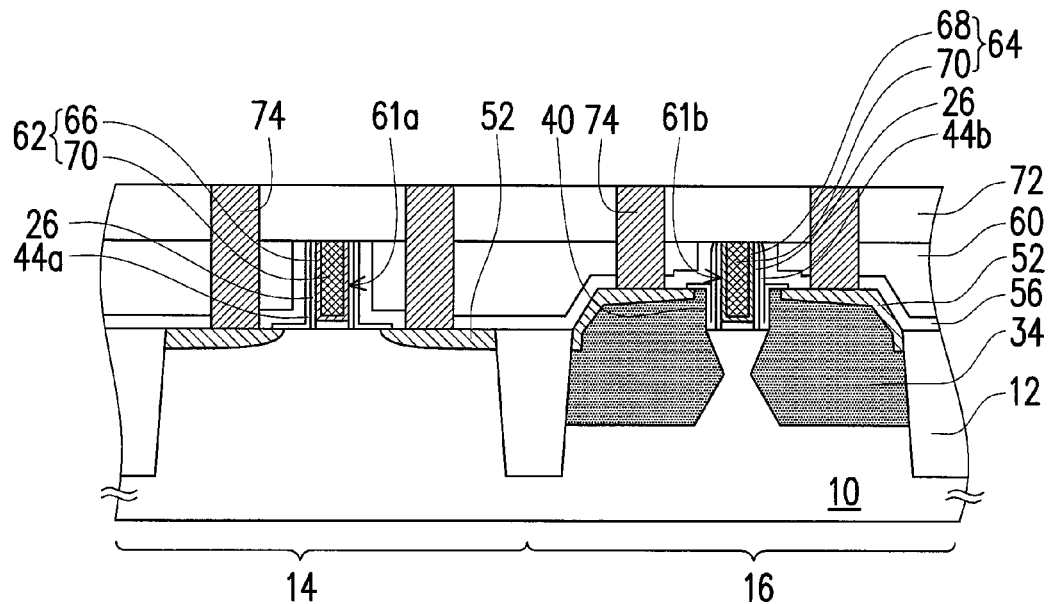

FIGS. 1-7 illustrate, in a cross-sectional view, a method for fabricating a semiconductor device according to an embodiment of this invention, wherein FIG. 7 also illustrates a PMOS device according to the embodiment.

Figure 1:
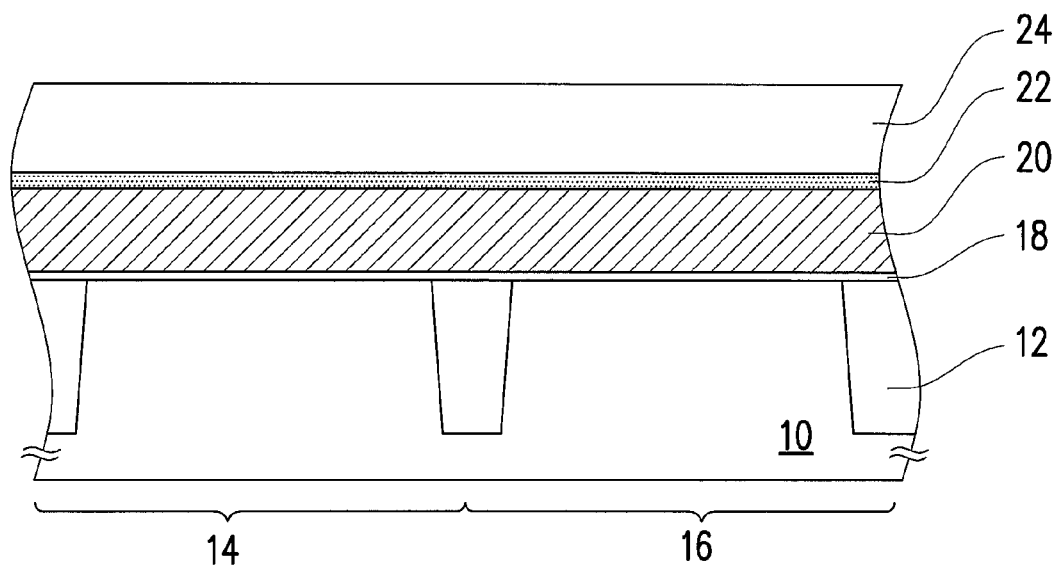
FIGS. 1-7 illustrate, in a cross-sectional view, a method for fabricating a semiconductor device according to an embodiment of this invention, wherein FIG. 7 also illustrates a PMOS device according to the embodiment.

Referring to FIG. 1, a semiconductor substrate 10 formed with a device isolation structure 12 therein and including an NMOS area 14 and a PMOS area 16 is provided, and a gate dielectric layer 18, a gate layer 20, a protective layer 22 doped with carbon, and a hard mask layer 24 are formed in sequence on the substrate 10. The substrate 10 may be a single-crystal silicon substrate. The gate dielectric layer 18 may include $SiO_2$ and high-K dielectric. The gate layer 20 may include poly-Si. The hard mask layer 24 may include silicon nitride (SiN) or a multi-layer structure of silicon dioxide and silicon nitride.

The protective layer 22 doped with carbon may include silicon carbonitride (SiCN), which has a quite low etching rate as compared to undoped silicon nitride (SiN). More specifically, the etching rate ratio of SiN to SiCN ranges from 10:1 to 30:1. The protective layer 22 may be formed by atomic layer deposition (ALD) or chemical vapor deposition (CVD). The content of the carbon doped in the protective layer 22 may range from 8 wt % to 8.5 wt %.

Figure 2:
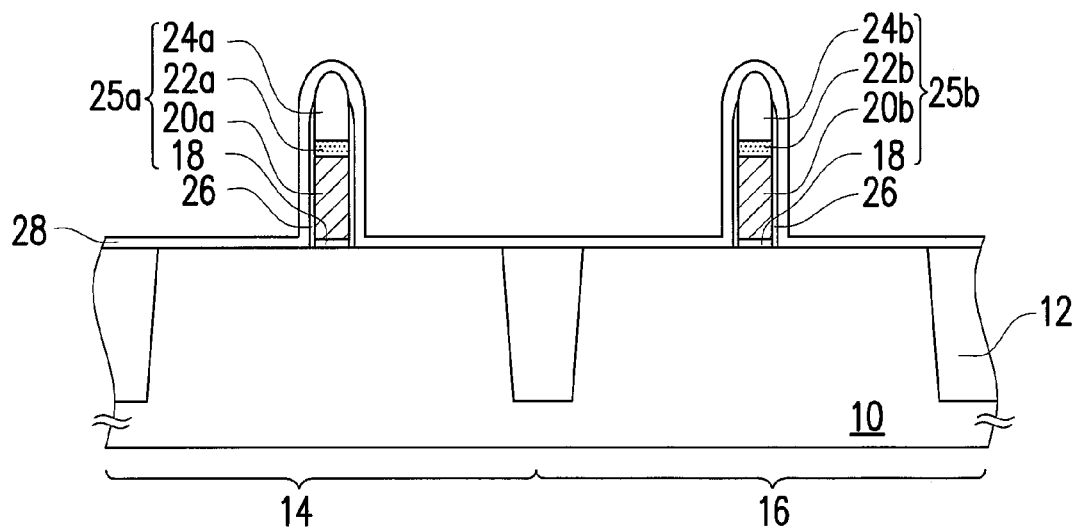

Referring to FIG. 2, the hard mask layer 24, the protective layer 22 and the gate layer 20 are patterned to form an NMOS stack 25a in the NMOS area 14 and a PMOS stack 25b in the PMOS area 16. The NMOS stack 25a includes, from bottom to top, a gate dielectric layer 18, a dummy gate 20a, a protective layer 22a doped with carbon, and a cap layer 24a defined from the hard mask 24. The PMOS stack 25b includes, from bottom to top, a gate dielectric layer 18, a dummy gate 20b, a protective layer 22b doped with carbon, and a cap layer 24b defined from the hard mask layer 24.

Thereafter, another protective layer 26 is formed on the sidewalls of the NMOS stack 25a and the PMOS stack 25b, possibly by depositing a thin precursor layer and then anisotropically etching the same. A blocking layer 28 is then deposited over the substrate 10, being substantially conformal with the resulting structure formed as above. The blocking layer 28 may include SiN.

Figure 3:
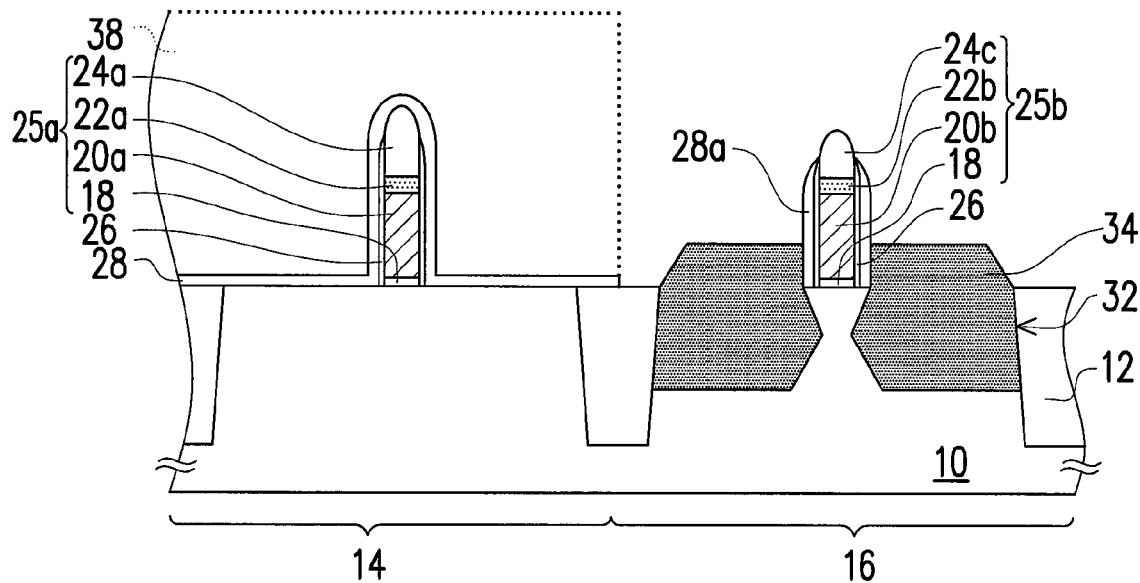

Referring to FIG. 3, the blocking layer 28 in the PMOS area 16 is selectively partially removed to form a spacer 28a on the sidewall of the protective layer 26 on the sidewall of the PMOS stack 25b in the PMOS area 16, while the blocking layer 28 in the NMOS area 14 is entirely retained. Recesses 32 are then formed in the substrate 10 beside the spacer 28a, and then a semiconductor compound layer 34 is formed based on the recesses 32 with the blocking layer 28 and the spacer 28a as a blocking mask. The semiconductor compound layer 34 may be formed by an epitaxy process, and may protrude out of the surface level of the substrate 10. The epitaxial product may be SiGe capable of inducing a compressive strain in the channel of the PMOS transistor.

The selective etching of the blocking layer 28 utilizes a patterned mask layer 38 (indicated by the dot line), which is usually a patterned photoresist layer. The mask layer 38 in combination with the PMOS stack 25b and the spacer 28a serves as a mask in the etching process for forming the recesses 32, and the patterned mask layer 38 is removed before the epitaxy process. Since the PMOS stack 25b serves as a part of the etching mask in the etching process of the recesses 32, the cap layer 24c on the dummy PMOS gate 20b is thinner than the cap layer 24a on the dummy NMOS gate 20a after the etching process.

Figure 4:
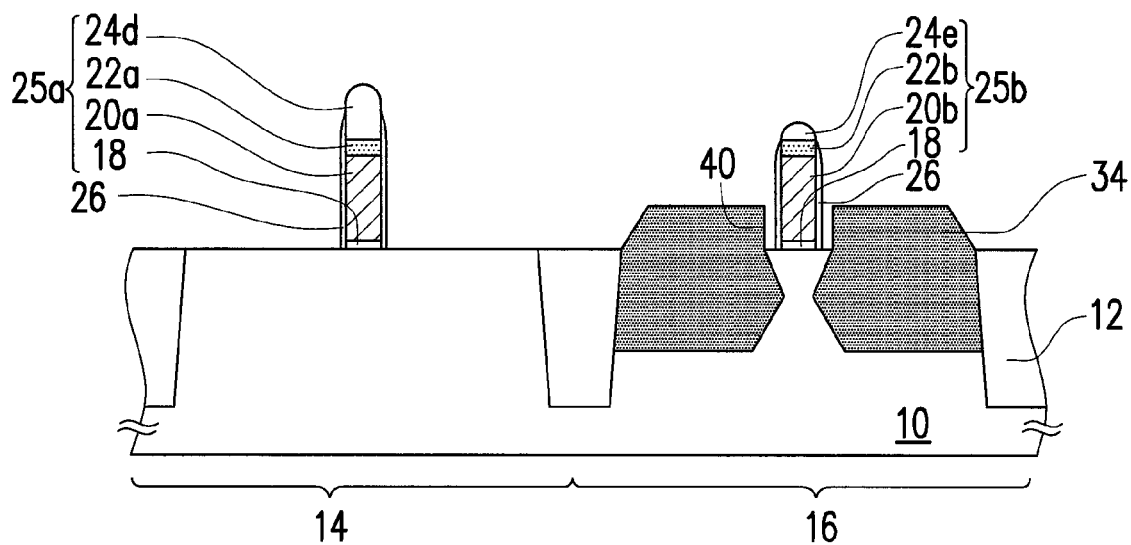

Referring to FIG. 4, the remaining blocking layer 28 and the spacer 28a are both removed, possibly with wet etching. A gap 40 is formed between the semiconductor compound layer 34 and the protective layer 26 of the PMOS stack 25b after the spacer 28a is removed, if the semiconductor compound layer 34 is formed protruding out of the surface of the substrate 10. The cap layers 24a and 24c are thinned in the removal process as including the same material of the blocking layer/spacer 28/28a, resulting in a thinner cap layer 24d and an even thinner cap layer 24e in the NMOS stack 25a and the PMOS stack 25b, respectively. Since the cap layer 24c is thinner than the cap layer 24a as mentioned above and both of them have the same amount of loss in the removal process, the resulting cap layer 24e over the dummy PMOS gate 20b is thinner than the resulting cap layer 24d over the dummy NMOS gate 20a, and may be too thin to keep its capping effect.

However, even if the cap layer 24e over the dummy PMOS gate 20b is too thin to keep its capping effect, the corner of the dummy PMOS gate 20b is still not exposed because the protective layer 22b has been disposed on the dummy PMOS gate 20b.

Referring to FIG. 5, a liner layer 44a and 44b is formed on the sidewalls of the protective layer 26 of the NMOS stack 25a and the PMOS stack 25b. The liner layer 44b beside the PMOS stack 25b is formed on the sidewall of the protective layer 26, the surface of the substrate 10 in the gap 40, and the semiconductor compound layer 34, and may fill up the gap 40. Spacers 48 are formed on the sidewalls of the liner layer 44a and 44b and above portions of the same. The liner layer 44a, the liner layer 44b and the spacer 48 with such structures can be formed by forming a liner material layer and a conformal spacer material layer, and anisotropically etching the two layers in sequence.

Then, a metal silicide layer 52 is formed on the substrate 10 beside the spacer 48 on the sidewall of the NMOS stack 25a and on the semiconductor compound layer 34 beside the spacer 48 on the sidewall of the PMOS stack 25b. The silicide layer 52 may include a metal silicide of which the metal is selected from the group consisting of tungsten, aluminum, copper, titanium, tantalum, niobium, erbium, molybdenum, cobalt, nickel, platinum and alloys thereof, and may be formed by a self-aligned silicide (salicide) using the spacer 48 as a blocking layer.

The salicide process usually includes depositing a blanket refractory metal layer (not shown), reacting the materials of the substrate 10 and the semiconductor compound layer 34 with the metal to form metal silicide, and then removing the unreacted metal. Since the corner of the dummy PMOS gate 20b is not exposed because of the protective layer 22b thereon, it will not react with the metal in the salicide process and hence does not eventually cause dummy gate residue in the gate replacement process.

Referring to FIG. 6, the spacer 48 and the cap layers 24d and 24e are removed. A contact etching stop layer (CESL) 56 is then formed over the resulting structure, and an inter-layer dielectric (ILD) layer 60 is formed on the CESL 56.

Referring to FIGS. 6-7, the resulting structure is subjected to a planarization process, such as a chemical mechanical polishing (CMP) process, to remove a portion of the ILD layer 60, a portion of the CESL 56, and the protective layer 22a and 22b, thereby exposing the dummy NMOS gate 20a and the dummy PMOS gate 20b. The dummy gates 20a and 20b are removed, and then a NMOS metal gate 62 is formed in the hole 61a formed by removing the dummy NMOS gate 20a and a PMOS metal gate 64 formed in the hole 61b formed by removing the dummy PMOS gate 20b.

In an embodiment, the NMOS metal gate 62 includes a U-shaped work-function metal layer 66 with a work function suitable for NMOS and a low-resistance metal material 70, and the PMOS metal gate 64 includes a U-shaped work-function metal layer 68 with a work function suitable for PMOS and the low-resistance metal material 70. The process for forming the metal gate structure may include: forming, after the dummy gates 20a and 20b are removed, a layer of the material of the metal layer 66 in the NMOS area 14 and a layer of the material of the metal layer 68 in the PMOS area 16, depositing a layer of the low-resistance metal material 70 in both the NMOS area 14 and the PMOS area 16 filling up the holes 61a and 61b, and removing all the metal materials outside of the holes 61a and 61b.

Referring to FIG. 7 again, after the metal gates 62 and 64 are formed, another ILD layer 72 is formed over the resulting structure, and a plurality of contact plugs 74 are formed through the ILD layers 72 and 60 and the CESL 56 to contact the metal silicide layer 52.

In the above embodiment, since a protective layer doped with carbon is formed on the dummy gate in the PMOS stack having a thinner cap layer and the protective layer doped with carbon has a low etching rate, the corner of the dummy gate in the PMOS stack is not exposed in the later spacer removal process and does not react with the metal in the later salicide process, so that dummy gate residue does not occur in the gate replacement process.

In addition, though the silicide layer (52) is formed before the CESL (56) and the ILD layers (60 and 72) are formed in the above embodiment, the silicide layer may alternatively be formed on the substrate 10 and the semiconductor compound layer 34 after the CESL and the ILD layers are formed in another embodiment.

Figure 8:
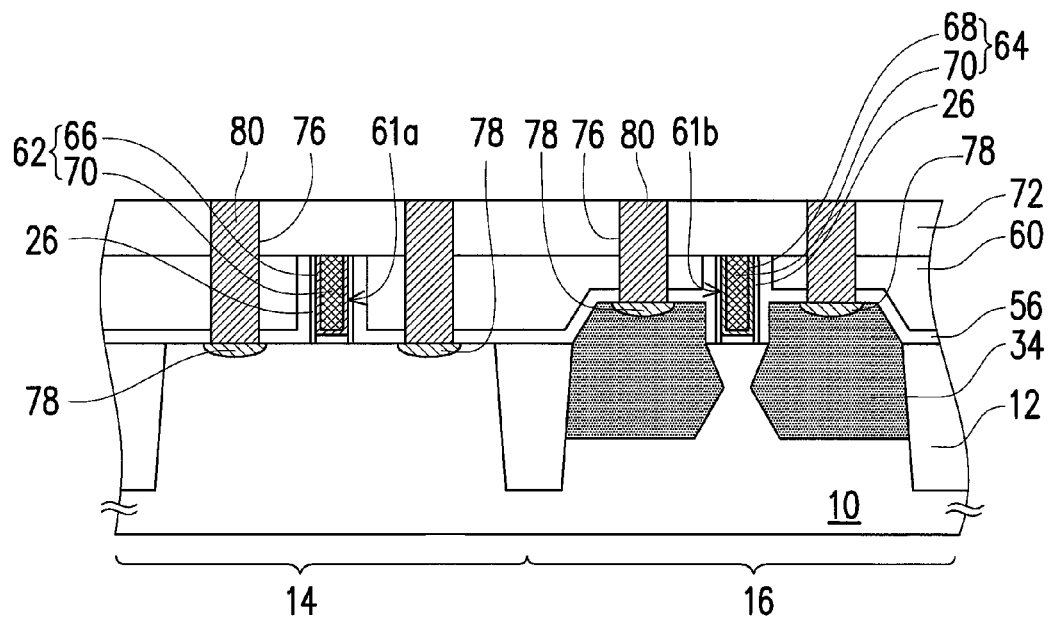
FIG. 8 illustrates, in a cross-sectional view, a method for fabricating a semiconductor device according to another embodiment of this invention, which is different mainly in the process for forming the silicide layer.

FIG. 8 illustrates such an embodiment. Referring to FIG. 8, this embodiment is different from the precedent one in the following aspects. The liner layer 44a and 44b, the spacer 48 and the silicide layer 52 are not formed after the step shown in FIG. 4. After a plurality of contact openings 76 are formed through the ILD layers 72 and 60 and the CESL 56 to expose portions of the substrate 10 in the first area 14 and portions of the semiconductor compound layer 34 in the second area 16, a silicide layer 78 is formed on the exposed portions of the substrate 10 and the exposed portions of the semiconductor compound layer 34, possibly through a salicide process. A plurality of contact plugs 80 is then formed in the contact openings 76, possibly by depositing a conductive layer filling up the contact openings 76 and then removing the conductive layer outside of the contact openings 76 by CMP.

In the above additional embodiment, since the protective layer 22a on the dummy NMOS gate 20a has the same thickness as the protective layer 22b on the dummy PMOS gate 20b, the tops of the two gate stacks are at the same level, so that the portions of the CESL 56 located on the protective layers 22a and 22b can well serve as a stop layer in the CMP process for the ILD layer 60.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method for fabricating a semiconductor device, comprising:
    forming, on a substrate with a first area and a second area, a gate layer, a first protective layer doped with carbon, and a hard mask layer in sequence;
    patterning the hard mask layer, the first protective layer and the gate layer to form a first stack in the first area and a second stack in the second area;
    forming a second protective layer on sidewalls of the first and the second stacks;
    forming a blocking layer in the first area and a first spacer on a sidewall of the second protective layer on the sidewall of the second stack in the second area;
    forming a semiconductor compound layer in the substrate beside the first spacer;
    removing the blocking layer and the first spacer;
    removing the hard mask layer in the first stack and the second stack;
    forming a contact etching stop layer over the substrate covering the first protective layer in the first stack and the second stack, after the hard mask layer in the first stack and the second stack is removed;
    forming a dielectric layer on the contact etching stop layer; and
    planarizing the dielectric layer using the contact etching stop layer above the first protective layer as a stop layer.

2. The method of claim 1, wherein the blocking layer and the first spacer are formed from the same precursor layer.

3. The method of claim 1, wherein an etching rate ratio of the hard mask layer to the first protective layer ranges from 10:1 to 30:1.

4. The method of claim 1, wherein the first and the second protective layers both comprise silicon carbonitride (SiCN).

5. The method of claim 1, wherein the first area is an NMOS area, and the second area is a PMOS area.

6. The method of claim 5, wherein the semiconductor compound layer comprises SiGe.

7. The method of claim 1, wherein forming the blocking layer and the first spacer comprises:
    forming the precursor layer over the substrate;
    forming a mask layer covering the precursor layer in the first area but exposing the precursor layer in the second area; and
    anisotropically etching the precursor layer with the mask layer as a mask, such that a portion of the precursor layer remains on the sidewall of the second protective layer on the sidewall of the second stack to be the first spacer, while the precursor layer remaining in the first area is the blocking layer.

8. The method of claim 7, wherein forming the semiconductor compound layer comprises:
    etching the substrate in the second area, with the mask layer, the second stack and the first spacer as a mask, to form recesses in the substrate beside the first spacer;
    removing the mask layer; and
    selectively depositing the semiconductor compound layer in the recesses, using the blocking layer and the first spacer as a mask.

9. The method of claim 8, wherein the semiconductor compound layer protrudes out of the recesses so that a gap is left between the second stack and the semiconductor compound layer after the first spacer is removed.

10. The method of claim 1, further comprising, after the blocking layer and the first spacer are removed but before the hard mask layer in the first stack and the second stack is removed:
    forming second spacers on the sidewalls of the first and the second stacks; and
    forming a silicide layer in the substrate beside the second spacers in the first area and the second area, and
    further comprising:
    removing the second spacers in the step of removing the hard mask layer.

11. The method of claim 1, further comprising:
    forming a plurality of contact openings through the dielectric layer and the contact etching stop layer to expose portions of the substrate in the first area and portions of the semiconductor compound layer in the second area; and
    forming a silicide layer on the exposed portions of the substrate and the exposed portions of the semiconductor compound layer.

12. A method for fabricating a semiconductor device, comprising:
    forming, over a substrate, a gate layer, a first protective layer doped with carbon, and a hard mask layer in sequence, wherein the hard mask layer comprises silicon nitride;
    patterning the hard mask layer, the first protective layer and the gate layer to form a stack;
    forming a second protective layer on a sidewall of the stack;
    forming a spacer on a sidewall of the second protective layer on the sidewall of the stack;
    forming a semiconductor compound layer in the substrate beside the spacer;
    removing the spacer; and
    removing the hard mask layer in the stack.

13. The method of claim 12, wherein the first protective layer and the second protective layer both comprise silicon carbonitride (SiCN).

14. The method of claim 12, wherein the semiconductor device is a PMOS device.

15. The method of claim 14, wherein the semiconductor compound layer protrudes out of a surface of the substrate so that a gap is present between the semiconductor layer and the second protective layer.

\* \* \* \* \*